United States Patent [19]

Kalkhof et al.

[11] Patent Number: 4,595,968
[45] Date of Patent: Jun. 17, 1986

[54] ELECTRONIC FINAL STAGE FOR SWITCHING ELECTRO-MAGNETIC VALVE WITH THE ASSISTANCE OF CONTROLLED CURRENT SOURCE

[75] Inventors: Bernd Kalkhof, Reutlingen; Horst Lohmüller, Tübingen, both of Fed. Rep. of Germany

[73] Assignee: Robert Bosch GmbH, Stuttgart, Fed. Rep. of Germany

[21] Appl. No.: 739,961

[22] Filed: May 31, 1985

[30] Foreign Application Priority Data

Jun. 28, 1984 [DE] Fed. Rep. of Germany ....... 3423769

[51] Int. Cl.⁴ .......................................... H01H 47/32
[52] U.S. Cl. .................................................... 361/152
[58] Field of Search .......................................... 361/152

[56] References Cited

U.S. PATENT DOCUMENTS 3,287,608 11/1966 Pokrant .............................. 361/152
3,896,346 7/1975 Ule .
4,556,926 12/1985 Yanagida ......................... 361/152 X Primary Examiner—Michael L. Gellner
Attorney, Agent, or Firm—Frishauf, Holtz, Goodman & Woodward

[57] ABSTRACT

In order limit the rate of rise of current when the final stage transistor T8 is switched, the base current of the final stage transistor is supplied by a first current-controlled current source when the final stage transistor switches on an inductive load. The final stage transistor in this circuit can be given an integrating behavior with a very small MOS negative feedback capacitor, leading to the control current input of the first controlled current source, to which a diode-connected switching transistor T4 supplies a constant current when a driver transistor T7 is blocked by an input signal $U_E$. When the driver transistor T7 is made conducting, the constant current is diverted to the driver transistor and the base current of the final stage transistor T8 is cut off except for the dynamic contribution of feedback capacitor, while the reverse peak diode D provides protection against voltage spikes. A second current-controlled current source is inteposed between a constant current source and the diode-connected switching transistor in order to provide voltage decoupling between the constant current source and the switching transistor.

8 Claims, 2 Drawing Figures

ELECTRONIC FINAL STAGE FOR SWITCHING ELECTRO-MAGNETIC VALVE WITH THE ASSISTANCE OF CONTROLLED CURRENT SOURCE

The invention concerns the control of the switching over of electromagnetic valves and the like by means of a final stage transistor.

Electronic stages of this general type are known from many publications, as for example, U.S. Pat. No. 3,896,346. In the disclosure of that patent, the energizing winding of a magnetic valve is switched by a final stage transistor as an inductive load. The circuit has provisions for limiting the high voltages that arise at the inductive load, whereby the same time there is a limiting of the rate of rise of the load currents. In this case, the inductance of the load is used in order to obtain the desired effect. When such a final stage is connected to a load of a different value of inductance, some matching or adjustment of the electrical behavior of the final stage is necessary.

SUMMARY OF THE INVENTION

It is an object of the present invention to provide a final stage for switching an inductive load in which the rate of rise of the load currents and the high voltages produced by the interruption of the load current can be limited in a manner that is independent of the inductance of the load so that the circuit may be used for various kinds of magnetic valves without change, and a magnetic valve can be replaced by another valve of different inductance without troublesome modification of the circuit.

Briefly, the base current of the final stage transistor is made controllable by a current-controlled current source, while a feedback capacitor is connected between the collector of the final stage transistor to the control input of the current source to provide an integrating behavior for the final stage which is independent of the load. In that way, the final stage of the invention has the capability of switching loads of much greater inductance and thus to make it possible to avoid using cumbersome known schemes for attaining switching with controlled rise and fall times, all this without risk of damage of the final stage by voltage or current pulses.

Many other advantages are also obtainable. The final stage can be constituted as an integrated circuit, with the feedback capacitance in the form of a metal-oxide-semiconductor (MOS) capacitor. This capacitance can then be operated without bias, such as would be necessary in the case of a blocking layer capacitance. A particularly useful version of the capacitive feedback during switching operation of the final stage is provided when the control current of the current-controlled source is delivered by a constant current source which is connected to the control input through a switching transistor.

BRIEF DESCRIPTION OF THE DRAWINGS

The invention is further described by way of illustrative example with reference to the annexed drawing in which.

DESCRIPTION OF THE ILLUSTRATED EMBODIMENT

Figure 1:
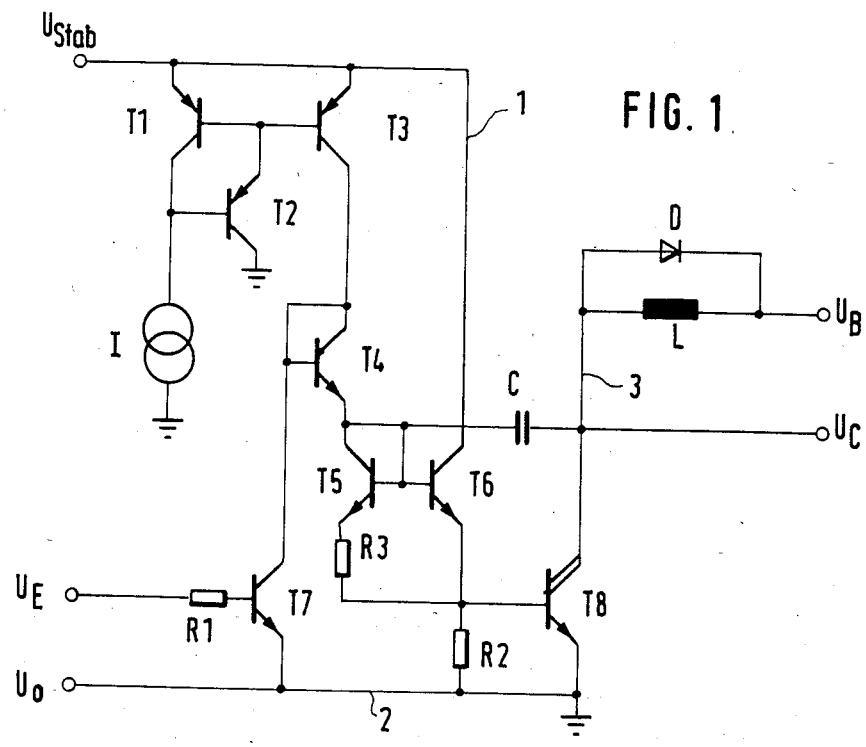
FIG. 1 is a circuit diagram of a monolithic integrated final electronic switching stage according to the invention.
Figure 2:
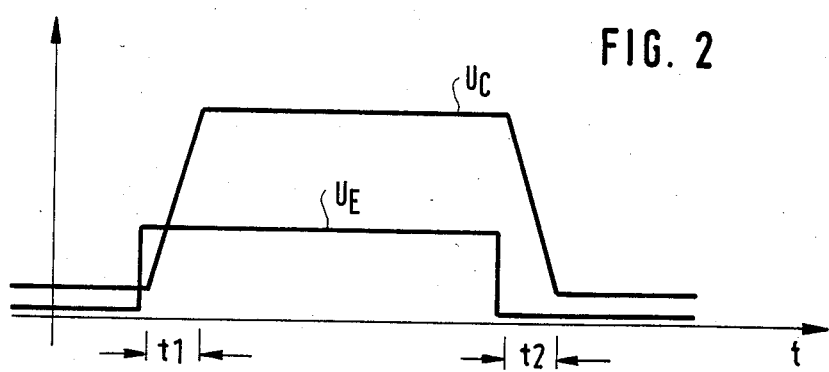
FIG. 2 is a graph of signals observed in the circuit of FIG. 1 for explanation of the operation of the latter.

The electric circuit shown in FIG. 1 is connected between the two output conductors of a stabilized power supply, the conductor 1 supplying a stabilized supply voltage $U_{stab}$ and the conductor 2 is at a reference voltage $U_o$, typically apparatus or chassis ground, the latter being shown by the ground connection in FIG. 1. The emitter of a final stage transistor T8 is connected to the grounded conductor 2, while its collector is connected to conductor 3, which connects it to one terminal of an inductive load L, of which the other terminal is connected to a battery voltage $U_b$. The latter may be the battery voltage of a motor vehicle which, in comparison with the stabilized voltage of conductor 1, is unstabilized. The final stage transistor T8, as connected in FIG. 1, accordingly switches the current through the load L. A diode D is connected in parallel to the load L in order to provide a short return path for the reverse potential kick that is produced when the current through the load L is interrupted, thereby protecting the transistor T8 from reverse voltage spikes.

The base of the final stage transistor T8 is connected through a reistance R2 to the grounded conductor 2. The base current of the final stage transistor T8 is delivered from the emitter of a transistor T6 which has its collector connected to the conductor 1. The base of the transistor T8 is connected to the base and also to the collector of a transistor T5 which has its emitter connected through a resistance R3 to the base of the final stage transistor T8. The combination of the transistors T5 and T6 and the resistance R3 constitute a controlled current source in which the control current and the output current are unequal. Such current sources are known, for example, from the publication "Phillips Technische Rundschau", Vol 32, 1971/72, No. 1, pages 1–12. It is here explained that the current amplification of the current-controlled current source, in addition to depending upon the semiconductor characteristics of the transistors T5 and T6, and from the temperature, is primarily determined by the resistance R3 (When R3=6 k$\Omega$ there is a current amplification of about 10). The control current of the current source flows through a switching transistor T4, of which the emitter is connected to the collector of the transistor T5. When the emitter current of the switching transistor T4 is switched, the final transistor T8 switche correspondingly.

A capacitance C is interposed between the input of the controlled current source T5, T6 and the collector of the final stage transistor T8. The input signal at the input of the current controlled current source T5, T6 appears inverted at the collector of the final stage transistor T8, because the amplification factor of the current source is positive. In consequence, the capacitance C provides negative feedback with a high pass characteristic in the feedback circuit branch. The system, as a whole, thereby acquires an integrating behavior that shows up in switching operations by a finite flank steepness of the voltage at the collector of the final stage transistor T8, independent of circuitry farther out, and, in particular, independent of the inductance of the load L. When the circuit is constructed in monolithic circuit technology, the capacitance is constituted by a MOS capacitor of a value of a few picofarads. The flank steepness of the output voltage during switching can then be set by the current amplification factor of the current controlled current source T5, T6.

The switching transistor T4, connected as a diode, is subjected to a constant current at its collector, while its base connected to the collector, is also connected through a driver transistor T7 to the grounded conductor 2. The base of the driver transistor T7 receives an input voltage $U_e$ through a series resistance $R_1$. This arrangement has a particular advantage that the constant current through the switching transistor T4, which is supplied to the current source T5, T6, is not switched on and off, but simply has its path changed by the input signal $U_e$. If the driver transistor T7 is conducting, the current of the constant current source flows through the collector-emitter path of the driver transistor T7 to the grounded line 2, whereas when the driver transistor T7 is blocked, the current controlled current source T5, T6 is subject at its input to the constant current flowing through the switching transistor T4. In consequence, particularly rapid switchover actions, which involve very little capacitance, are obtained.

A second current controlled current source T1, T2, T3 is interposed in the illustrated case between the constant current source I and the switching transistor T4 in order to obtain voltage decoupling of the constant current source from the switching transistor T4 which has a different potential according to its switching condition. The constant current source I, accordingly, delivers control current for the current source T1, T2, T3 which is, as a whole, connected between the stabilized voltage line 1 and ground. Furthermore, with suitable dimensioning of the emitters of the current source T1, T2, T3, it is possible to compensate for the temperature effect of the following circuits. Such temperature compensation methods are well known in the art and, accordingly, the details do not need to be set forth here.

Although the invention has been described with reference to a particular illustrative example, it will be understood that modifications and variations are possible within the inventive concept.

We claim:

1. Electronic final stage for switching the state of an electromagnetic on-off control device providing an inductive load for a final stage transistor (T8) of said stage, comprising:
   a current-controlled current source (T5, T6) connected to supply its output current to the base of said final stage transistor (T8), thereby substantially supplying and controlling the base current of said final stage transistor, and having a control terminal for controlling the current output of said source in response to current supplied to said control terminal, and
   a capacitance (C) connected between the collector of said final stage transistor and said control terminal of said current source for providing feedback of a kind giving an integrating characteristic to the circuit of said final stage transistor.

2. Final stage according to claim 1, in which said final stage transistor, said current control current source (T5, T6) and the circuits thereof are monolithically integrated in a semiconductor wafer and in which said capacitance (C) is a MOS capacitor and the current amplification factor of said current control source is greater than zero.

3. Final stage according to claim 2, also comprising a constant current source for intermittently supplying a steady current at the current control input of said current controlled current source (T5, T6) and further comprising a switching transistor (T4) connected so that its collector-emitter path is interposed in the current path from said constant current source to said control terminal and alternate switched path for said steady current is connected to said switching transistor.

4. Final stage according to claim 3, further comprising a second current-controlled current source (T1, T2, T3) having a control terminal connected to the output of said constant current source for supply of control current and having an output connected to said switching transistor so as to supply collector-emitter current to said switching transistor.

5. Final stage accordong to claim 4, in which said switching transistor (T4) has its collector and emitter connected together, thereby causing said switching transistor to function as a diode and in which a driver transistor (T7), having its base connected to a terminal for supply of a control voltage, is connected so that the collector-emitter path of said driver transistor (T7) is connected to the base of said switching transistor (T4).

6. Final stage according to claim 1, also comprising a constant current source for supplying a steady current at the control input of said current controlled current source (T5, T6) and further comprising a switching transistor (T4) for diverting said steady current from said control input into another switched path and connected so that its collector-emitter path is interposed in the current path from said constant current source to said control terminal.

7. Final stage according to claim 6, further comprising a second current-controlled current source (T1, T2, T3) having a control terminal connected to the output of said constant current source for supply of control current and having an output connected to said switching transistor so as to supply collector-emitter current to said switching transistor.

8. Final stage according to claim 7, in which said switching transistor (T4) has its collector and emitter connected together, thereby causing said switching transistor to function as a diode and in which a driver transistor (T7), having its base connected to a terminal for supply of a control voltage, is connected so that the collector-emitter path of said driver transistor (T7) is connected to the base of said switching transistor (T4).

* * * * *